United States Patent

[11] 3,631,300

[72] Inventor Jim V. Humble
Granada Hills, Calif.

[21] Appl. No. 59,187
[22] Filed July 29, 1970
[45] Patented Dec. 28, 1971
[73] Assignee Donald Stewart

[54] CIRCUIT DISTRIBUTION BOARD WITH WIRE RECEIVING CHANNEL
10 Claims, 6 Drawing Figs.

[52] U.S. Cl. .......... 317/122, 317/101 CC, 339/17 CF
[51] Int. Cl. .......... H02b 1/20
[50] Field of Search .......... 174/DIG. 3; 317/99, 100, 101 R, 101 C, 101 CC, 118, 122; 339/17 CF, 17 LC

[56] References Cited

UNITED STATES PATENTS

| | | | |
|---|---|---|---|
| 3,227,927 | 1/1966 | Parstorfer .......... | 317/101 C |
| 3,085,177 | 4/1963 | Thompson .......... | 317/101 CC |

*Primary Examiner*—Lewis H. Myers
*Assistant Examiner*—Gerald P. Tolin
*Attorney*—Ronald W. Reagin

ABSTRACT: A circuit distribution board is disclosed which includes a support board made from an electrically insulating material and which has a first side and a second side. Mounting means are provided for mounting electrical components on the support board in component columns on the first side of the support board. The mounting means includes a plurality of mounting holes through the support board, with each of the mounting holes being adapted to receive the electrical leads of any electrical components to be mounted on the support board. A channel member is secured to the support board adjacent to the component columns. The channel member is adapted to receive and protect connecting wires for electrically connecting predetermined ones of the electrical leads of any electrical components to be mounted on the support board in order to connect the electrical components into any desired circuit configuration.

INVENTOR.
JIM VERN HUMBLE
BY
Ronald W. Reagin
ATTORNEY

INVENTOR.
JIM VERN HUMBLE
BY

Ronald W. Reagin
ATTORNEY

CIRCUIT DISTRIBUTION BOARD WITH WIRE RECEIVING CHANNEL

This invention relates to circuit distribution boards and more particularly to a circuit distribution board which utilizes a novel channel arrangement to provide a combination which requires a minimum of design effort and time to adapt the circuit distribution board to a particular required circuit, which provides a circuit distribution board which has much higher component density than conventional two-sided printed circuit distribution boards and which is much cheaper to manufacture than conventional multilayer printed circuit distribution boards.

The art of electrical circuit interconnection has been completely revolutionized since the introduction of printed circuit boards in about 1950. As is well known, these printed circuit boards, which may generically be called "circuit distribution boards," consists of boards constructed from an electrical insulating material which has a plurality of electrical components mounted on one side thereof, with the components being mounted by their electrical leads extending through small holes in the board which have a diameter slightly larger than the diameter of the electrical leads of the components. Typically, these holes are plated through with a material which is electrically conductive, and the holes themselves are electrically interconnected on the backside of the printed circuit board by an intricate pattern of electrically conductive material, such as copper, which is secured to the insulative board in any suitable manner, which interconnects the holes in a pattern which is dependent upon the circuit which is to be formed. The art of manufacturing this type of printed circuit board is highly developed and those skilled in the art know a number of different methods of manufacturing such printed circuit boards whereby a desired pattern of electrically conductive material may be formed on the backside of the printed circuit board.

However, the design of the pattern of the electrically conductive material to provide the necessary circuit interconnections between the leads of the electrical components has not proved to be so simple. The design of this pattern is termed the "art work" in the printed circuit art. Obviously, the main requirement of this art work is that the components be laid out on the circuit board in an optimal manner so that the necessary electrical interconnections can be made between the desired leads without crossing the conducting path interconnecting any other leads. In large circuit boards containing a large number of components, this has proven to be a very complicated task which typically requires up to 6 weeks of effort on the part of the art work engineer. To date, all efforts to standardize or automate this part of the design of the printed circuit board has failed. Also, obviously for each given circuit, the art work is unique and thus all efforts in the prior art to obtain anything resembling a standardized printed circuit board have failed.

A secondary problem with prior art printed circuit boards which is related to the difficulties in the art work discussed above occurs when any changes are made in a circuit once it has been designed. It is not uncommon, especially in the design and manufacture of complex circuits and systems, to have to make numerous changes in the design of a circuit once a preliminary design has been achieved. Frequently, these changes are required not only because changes must be made in the circuit itself in order that it may perform its own function better, but because changes have been made in a totally different part of the system which require corresponding changes in a given circuit in order that it may continue to perform its same function adequately. If such changes must be made in a circuit after its art work has once been designed, it frequently requires that an entirely new art work be developed for the circuit, with the resultant expense and loss in time before the manufacturing effort can be continued. In such instances, all of the expense and effort which went into the design of the original art work is essentially completely lost.

It is accordingly an object of the present invention to provide an improved circuit distribution board.

It is another object of the present invention to provide an improved circuit distribution board which does not require the design of elaborate art work as is required in prior art printed circuit boards.

It is yet another object of the present invention to provide an improved circuit distribution board in which changes can be made in the design and connection of the circuit without requiring any significant changes in the circuit distribution board.

It is yet another object of the present invention to provide a standardized circuit distribution board which can be used to interconnect the electrical components of any electrical circuit.

Another difficulty with printed circuit boards of the type described above is that it is very difficult to achieve high component density on conventional two-sided circuit boards of this type. In very simple applications this may not be very much of a problem, but in an increasing number of applications today, high circuit density is one of the severe requirements in the design. If relatively large circuit boards must be used to interconnect electrical components, most of the advantages of the microminiaturized components which are available today, such as integrated circuit chips and hybrid circuit elements, are lost.

Of necessity, the two-sided printed circuit board of the type described above is inherently a two-dimensional device, and the art work requirements described above limits the number of connections which can be made on one side of an insulating board of given dimensions. This results in a corresponding limitation on the number of electrical leads that can be interconnected on one side of an insulating board, and thus a corresponding limitation on the number of components which can be mounted on the board. The most successful response to date of the industry to this problem has been the introduction of the multilayer printed circuit board. This is a circuit distribution board in which a plurality of relatively conventional two-sided printed circuit boards are laminated together, and the components to be interconnected are mounted on one of the outer sides of the laminate. Each layer of the laminate then interconnects selected ones of the leads of the components which are mounted on the board.

The difficulties with the multilayer printed circuit boards are obvious. First, the art work problems, as described above, are increased many folds over the art work problems of conventional two-sided printed circuit boards. Second, the different layers of the laminate require very precise alignment when electrical connections must be made to as many as 20 layers within the board, and thus the quality control problems and precision manufacturing problems and the manufacturing costs of the multilayer printed circuit board increase geometrically with increasing numbers of laminated in the multilayer printed circuit boards. Third, the problem of design change is even more critical than in the case of the conventional two-sided board described above. If any changes must be made, it frequently results in the scrapping of a very expensively designed and manufactured multilayer printed circuit board.

It is accordingly yet another object of the present invention to provide a circuit distribution board which allows increased electrical component density.

It is yet another object of the present invention to provide an improved circuit distribution board which is simple to manufacture and low in cost which allows increased electrical component density.

It is still another object of the present invention to provide a standardized circuit distribution board which provides electrical interconnection for any circuit design and which inherently has extremely high electrical component density.

Briefly stated, and in accordance with the presently preferred embodiment of the invention, a circuit distribution board is provided which includes a support board made from an electrical insulating material and which has a first side and a second side. Mounting means are provided for mounting electrical components on the support board in component columns on the first side of the support board. The mounting means includes a plurality of mounting holes through the support board, with each of the mounting holes being adapted to receive the electrical leads of any electrical components to be mounted on the support board. A channel member is secured to the support board adjacent to the component columns. The channel member is adapted to receive and protect connecting wires for electrically connecting predetermined ones of the electrical leads of any electrical components to be mounted on the support board in order to connect the electrical components into any desired circuit configuration.

For a complete understanding of the invention, together with an appreciation of other objects and advantages thereof, see the attached drawings and the following detailed descriptions of these drawings, in which.

Figure 1:
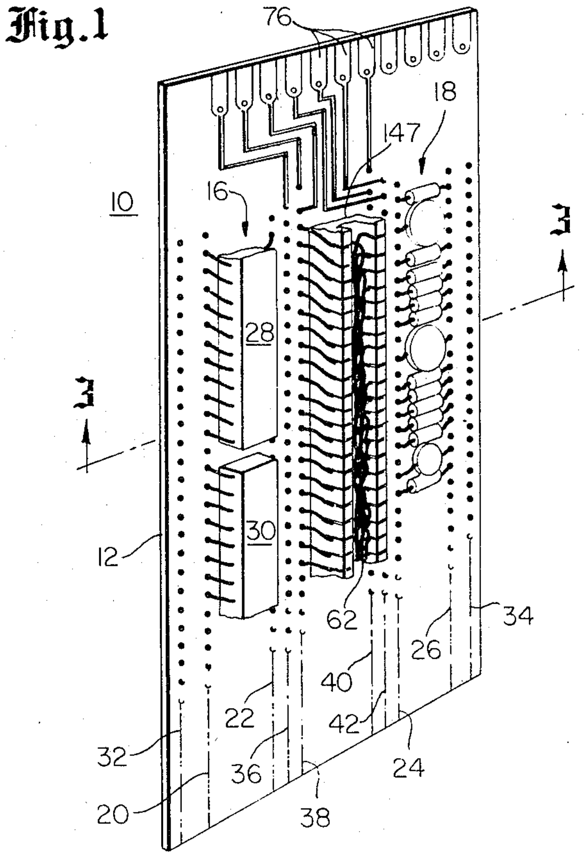
FIG. 1 shows a perspective view of the front side of a circuit distribution board which incorporates the presently preferred embodiment of the invention.

FIG. 1 shows a perspective view of the front or first side of a circuit distribution board 10 which incorporates the presently preferred embodiment of the invention. As shown therein, the circuit distribution board 10 includes a support board 12 made from a suitable electrically insulating material such as the support boards used in conventional printed circuit boards. The circuit distribution board 10 also includes a channel member 14 which is secured in any suitable manner along the center of support board 12, and two component columns 16 and 18, one located on each side of channel member 14, along which are mounted any electrical components to be interconnected into a circuit by circuit distribution board 10.

Any electrical components to be mounted in first component column 16 are secured to support board 12 by placing their electrical leads through the mounting holes along the axes 20 and 22. These mounting holes along axes 20 and 22 may be conventional plated through mounting holes such as are found in conventional printed circuit boards to which the leads of electrical components may be both mechanically and electrically secured by any suitable means, such as soldering. In a similar manner, any electrical components to be mounted in second component column 18 are secured to support board 12 by placing their leads through the mounting holes positioned along the axes 24 and 26. Merely by way of illustration, FIG. 1 shows two integrated circuit units 28 and 30 secured to support board 12 in component column 16 by securing their electrical leads to the mounting holes along axes 20 and 22. Similarly, for purposes of illustration only, a plurality of conventional electrical components (resistors, capacitors, diodes, etc.) are shown secured to support board 12 in component column 18 by having their electrical leads extended into the mounting holes along axes 24 and 26.

Additional mounting holes for components to be mounted in component column 16 are shown along the axis 32 to accommodate larger electrical components which will not fit between the axes 20 and 22. Similarly, additional mounting holes for components to be secured to support board 12 in component column 18 are shown along the axis 34 to accommodate larger electrical components which will not fit between the axes 24 and 26. As is described in detail in the description of FIG. 2 below, each of the mounting holes along the axis 32 is electrically connected to its adjacent respective mounting hole along the axis 20 and each of the mounting holes along the axis 34 is electrically connected to its respective adjacent mounting hole along the axis 26.

Figure 2:
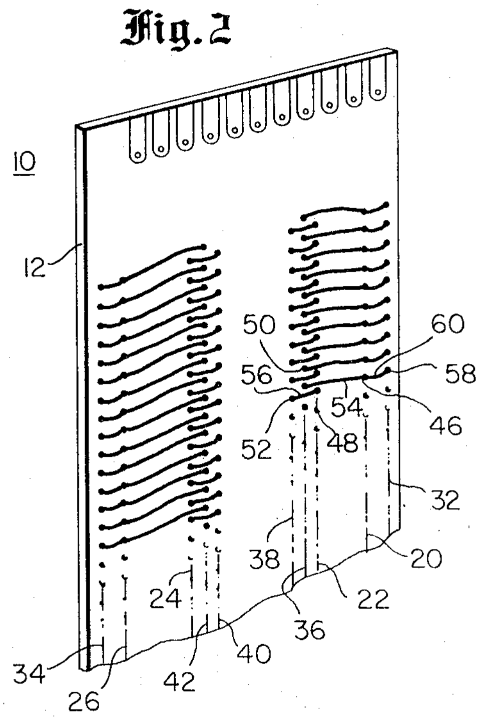
FIG. 2 shows a perspective view of the backside of the circuit distribution board of FIG. 1.

The circuit distribution board 10 also includes a plurality of interconnection holes, which may again be conventional plated through holes, positioned along the axes 36 and 38 for making electrical connection with the leads of any components mounted in component column 16 and interconnection holes positioned along the axes 40 and 42 for making electrical connection to the leads of any components mounted in component column 18. As is shown in FIG. 2, described below, each of the interconnection holes along axis 36 is electrically connected to a corresponding respective mounting hole along axis 20 and each of the interconnection holes along axis 38 is electrically connected to a corresponding respective mounting hole along axis 22. Similarly, each of the interconnection holes along axis 40 is electrically connected to a corresponding respective mounting hole along axis 24 and each of the interconnection holes along axis 42 is electrically connected to a corresponding respective mounting hole along axis 26.

FIG. 2 shows a perspective view of the back or second side of the circuit distribution board 10 and illustrates the manner in which the electrical connections mentioned above between the mounting holes and the interconnection holes is effected. As is shown in FIG. 2, the backside of support board 12 includes a plurality of electrical connectors formed thereon, preferably by convention printed circuit techniques, for electrically interconnecting the desired ones of the mounting and interconnection holes. For example, a typical component position 44 includes mounting holes 46 and 48 positioned along axes 20 and 22 respectively and interconnection holes 50 and 52 positioned along axes 36 and 38 respectively. Printed circuit conductor 54 electrically interconnects mounting hole 46 and interconnection hole 50. Similarly, printed circuit conductor 56 electrically interconnects mounting hole 48 and interconnection hole 52. The component position 44 is completed by mounting hole 58, positioned along axis 32 for mounting larger components, as mentioned above, and printed circuit conductor 60 electrically connecting mounting hole 58 to mounting hole 46.

Similar printed circuit conductors interconnect the various mounting and interconnection holes at each of the component locations along component columns 16 and 18.

Returning now to the description of FIG. 1, as is shown therein, the channel member 14 includes a plurality of slits or apertures in each side, with each of the apertures corresponding to a respective one of the interconnection holes positioned beside channel member 14. A plurality of insulated wires 62 are positioned within channel member 14, with each wire serving to electrically connect any two desired leads on any electrical components mounted on circuit distribution board 10 in either component column 16 or component column 18. Each of the wires 54 includes a first end and a second end. The first end of each wire 54 extends through one of the apertures in the side of channel member 14 and into the interconnection hole corresponding to that aperture and the lead of the electrical component which that particular wire serves to interconnect. The second end of the same wire 14 extends through another of the apertures in the side of channel member 14 and into the interconnection hole corresponding to the desired lead of the other electrical component which that particular wire is to interconnect. Of course, the ends of the wires 54 have their insulation removed therefrom, and the ends of the wires are then secured to their respective interconnection holes by any suitable means such as soldering.

Figure 3:
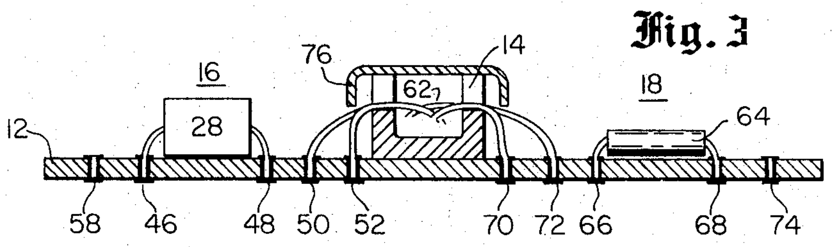
FIG. 3 shows a sectional view taken along the lines 3—3 of FIG. 1.

FIG. 3 shows a sectional view taken along the lines 3—3 of FIG. 1 and illustrates a typical component position of the type described in connection with FIGS. 1 and 2 above. FIG. 3 shows electrical leads from the integrated circuit chip 28 extending into the mounting holes 46 and 48 and shows the ends of two of the wires 62 extending through the apertures in the side of channel member 14 into the interconnection holes 50 and 52. FIG. 3 also shows the additional mounting hole 58. For clarity, the printed circuit conductors interconnecting the mounting holes and interconnection holes as shown in FIG. 2 are not shown in FIG. 3. Similarly, a resistor 64 in component column 18 is shown having its electrical leads extending into mounting holes 66 and 68. Interconnection holes 70 and 72 are shown which correspond respectively to mounting holes 66 and 68. Again, the ends of two of the wires 62 are shown extending through apertures of the other side of channel member 14 and entering the interconnecting holes 70 and 72. An additional mounting hole 74 along axis 34 is also shown.

FIG. 3 also shows each of the mounting and interconnection holes as being plated through with a conductive material, in a manner well known to those skilled in the art, and also shows a channel cover member 76, which was omitted from FIG. 1 for clarity, which is secured over the top of channel member 14 in any suitable manner after the circuit is completed to provide additional protection for the wires 62 in channel member 14.

Returning once again to the description of FIG. 1, the top portion thereof shows a plurality of conducting pads 76 which, in a conventional manner, may be used to provide electrical connections from the circuit distribution board 10 to other parts of a circuit or system which utilizes the circuit interconnection board 10. The conducting pad 76 may be formed by conventional printed circuit techniques and printed circuit conductors may interconnect the various conducting pads 76 with respective interconnection holes along the axes 36, 38, 40 and 42, as shown in FIG. 1. The top portion of channel member 14 is shown broken away to illustrate how the connections are made between the conducting pads 76 and the interconnection holes. In practice, the channel member 14 can extend upward in FIG. 1 past the end of these interconnection holes associated with conducting pads 76 and desired ones of the wires 62 can extend through apertures in the sidewall of channel member 14 to make any desired interconnections with the interconnection hole corresponding to the desired conducting pad 76. Of course, the printed circuit connections between the conducting pads 76 and the desired interconnecting holes could equally well have been made on the back or second side of the support board 12.

Figure 4:
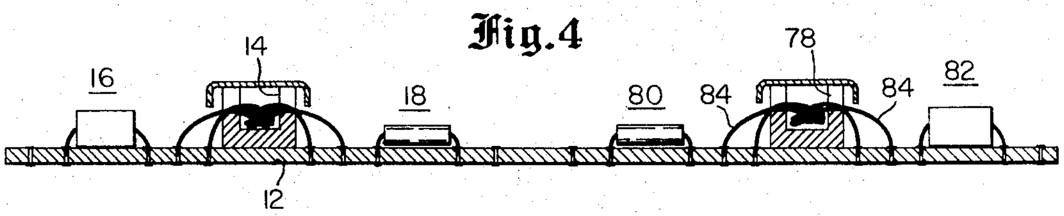
FIG. 4 shows a cross-sectional view similar to FIG. 3 and illustrates a second embodiment of the invention.

FIG. 4 shows a cross-sectional view similar to that in FIG. 3 but illustrates a second embodiment of the present invention. FIG. 4 shows a circuit distribution board 10 which includes an insulative support board 12, a channel member 14 and component columns 16 and 18 such as are shown in FIG. 3 above. The details of this portion of FIG. 4 are the same as in FIG. 3 and accordingly are not described again. However, FIG. 4 also shows a second channel member 78 which is similar to channel member 14 and is mounted on support board 12 spaced from and generally parallel to channel member 14. FIG. 4 also shows third and fourth component columns 80 and 82 in which electrical components may be mounted on circuit distribution board 10. Component channels 80 and 82 are positioned on each side of channel member 78. These component columns each includes mounting holes and interconnection holes similar to those described above and wires 84 are provided which run through channel member 78 to provide the necessary electrical interconnections between the electrical components in component columns 80 and 82.

Figure 5:
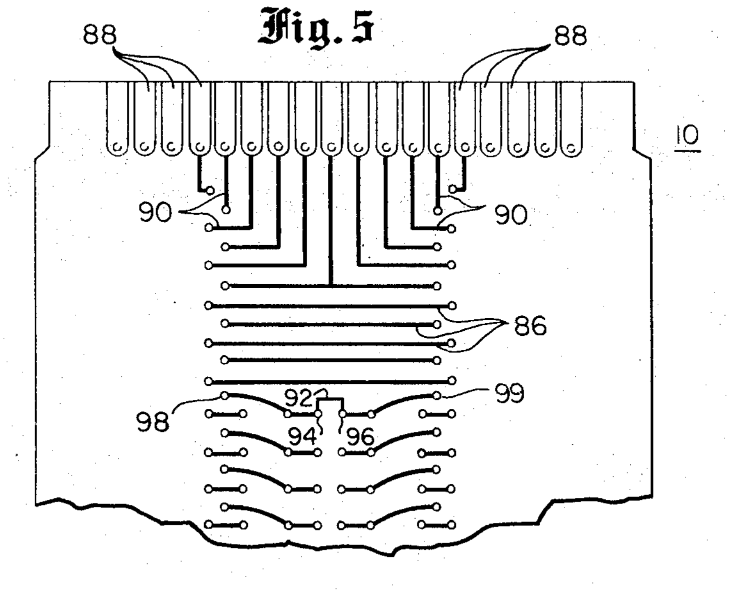
FIG. 5 is a plan view of the backside of the circuit distribution board of FIG. 4.

FIG. 5 shows a plan view of the back of the circuit distribution board 10 of FIG. 4. The view is similar to that shown in FIG. 2 except that four columns of mounting and interconnection holes are provided instead of two columns. Also a plurality of printed circuit conductors 86 are provided between a plurality of respective interconnection holes in component column 18 and component column 80 to provide any desired electrical interconnection between electrical components mounted in component columns 16 and 18 on the one hand and in component columns 80 and 82 on the other hand to avoid the necessity of running any wires between channel members 14 and 78.

FIG. 5 also shows a plurality of conductor pads 88 for making electrical interconnection between circuit distribution board 10 and other portions of the circuit or system located elsewhere, similar to the conductor pads 76 of FIG. 1. Printed circuit conductors 90 interconnect the conductor pads 88 with respective interconnection holes to provide any necessary external connections to the components or circuit mounted on circuit distribution board 10.

FIG. 5 also shows another means for making an electrical connection between components which may be mounted in component columns 16 or 18 and those mounted in component columns 80 and 82. A wire bridge or connector 92 which is shaped like a staple is provided with its legs placed in mounting holes 94 and 96. When connector 92 is soldered into mounting holes 94 and 96 (which may occur at the same time all the component leads are soldered to their respective mounting holes), this provides an additional electrical connection between interconnection holes 98 and 99 which may be used to interconnect components in component column 16 or 18 with those in component column 80 or 82.

Figure 6:
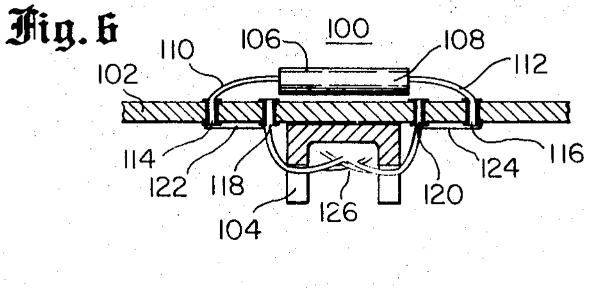
FIG. 6 shows a cross-sectional view of a circuit distribution board which incorporates yet another embodiment of the present invention.

FIG. 6 shows a cross-sectional view of yet another embodiment of the present invention. In this embodiment, a circuit distribution board 100 is provided which includes a support board 102 and a channel member 104 similar to those previously described. However, in this embodiment, the component channel 106 in which any electrical components 108 are mounted is positioned on one side of support board 102 while channel member 104 is mounted on the opposite side of support board 102. The electrical leads 110 and 112 of a typical component 108 are positioned in mounting holes 114 and 116 respectively. Interconnection holes 118 and 120 are provided corresponding respectively to mounting holes 114 and 116. Printed circuit conductor 122 electrically interconnects mounting hole 114 and interconnection hole 118. Similarly, printed circuit conductor 124 interconnects mounting hole 116 and interconnection hole 120. Insulated wires 126 within channel member 104 again provide the desired interconnection between selected interconnection holes in the circuit distribution board 100.

In all of the embodiment shown above, it will be appreciated by those skilled in the art that basically a universal circuit distribution board is provided which can be used to interconnect essentially any combination of electrical components into any desired circuit arrangement. Circuit distribution boards in accordance with the present invention eliminate the need for any art work design such as is required in prior art printed circuit boards and thus eliminate this step in the design of a circuit incorporating the present invention. Also, if the design engineer desires to make any changes in the circuit connection after the design has been initially completed, it is necessary only to make simple changes in the wire arrangement rather than to have to scrap the entire design of the board. Similarly, the present invention provides for greatly increased component density on a circuit distribution board of a given size.

Those skilled in the art will also appreciate that the present invention easily lends itself to automated manufacturing procedures. It requires only extremely simple automated equipment and programming to provide automatic component loading into the various component channels and to provide the necessary wiring interconnections between the desired interconnection holes. The wiring arrangement can be made either after the channel member is mounted on the support member or the wiring can be performed in the channel member in the desired pattern before the channel member is mounted on the support member. In either event, after the ends of the wires are placed in the interconnection holes and the electrical leads of the electrical components are placed in the mounting holes, the entire soldering operation can be effected simultaneously in any suitable manner known to those skilled in the art, such as wave soldering.

While the invention is thus disclosed and several different embodiments thereof described in detail, it is not intended that the invention be limited to these shown embodiments. Instead, many modifications will occur to those skilled in the art which lie within the spirit and scope of the present invention. For example, the circuit distribution board could be used as a "mother board," with a plurality of smaller boards mounted on plugs along one of the component columns. Also, in some applications, it may be possible to combine part of the interconnection holes with the mounting holes and to place both electrical component leads and the ends of the interconnection wires in the same holes, and then bring the wire into the channel member through an aperture in its side in the manner described above. It is thus intended that the invention be limited in scope only by the appended claims.

What is claimed is:

1. A circuit distribution board comprising, in combination:
a. a support board made from electrically insulating material and having a first and a second side;
b. first means for mounting electrical components on said support board in at least one component column on said first side of said support board, said first means including a plurality of mounting holes through said support board for receiving the electrical leads of any electrical components mounted in said component column;
c. a plurality of interconnection holes through said support board, each of said interconnection holes corresponding to a respective one of said mounting holes; and
d. printed circuit connectors electrically connecting each of said interconnection holes with its respective mounting hole.
e. means for receiving and protecting connecting wires for electrically connecting predetermined ones of said plurality of interconnection holes, said means comprising a channel member secured to said support board adjacent to said component column for receiving and protecting connecting wires for electrically connecting predetermined ones of the electrical leads on any electrical components mounted on said support board.

2. The combination of claim 1 in which said channel member includes a bottom section and two side sections, said side sections having a plurality of apertures each adjacent to and corresponding to a respective one of said interconnecting holes.

3. The combination of claim 2 which further includes a plurality of connecting wires positioned in said channel member, each of said wires having a first end and a second end, the first end of each wire extending through a first predetermined one of said apertures and being electrically connected to the respective interconnection hole corresponding to said first aperture, the second end of each wire extending through a second predetermined one of said apertures and being electrically connected to the respective interconnection hole corresponding to said second aperture.

4. The combination of claim 3 in which said channel member is secured to said first side of said support board adjacent to and substantially parallel to said component column.

5. The combination of claim 3 in which said channel member is secured to said second side of said support member opposed to said component column.

6. The combination of claim 4 in which said mounting means further includes second means for mounting additional electrical components in a second component column on said first side of said support board on the other side of and substantially parallel to said channel member, said second means including a second plurality of mounting holes through said support board for receiving the electrical leads of any electrical components mounted in said second component column, and further comprising:
a second plurality of interconnecting holes through said support board, each of said second plurality of interconnection holes corresponding to a respective one of said second plurality of mounting holes, and printed circuit connectors electrically connecting each of said second plurality of interconnection holes with its respective mounting hole.

7. The combination of claim 6 which further comprises:
a. a second channel member secured to said first side of said support board;
b. third means for mounting additional electrical components in a third component column on said first side of said support board on the first side of and substantially parallel to said second channel member, said third means including a third plurality of mounting holes through said support boards for receiving the electrical leads of any electrical components mounted in said third component column;
c. a third plurality of interconnection holes through said support board, each of said third plurality of interconnection holes corresponding to a respective one of said third plurality of mounting holes;
d. printed circuit connectors electrically connecting each of said third plurality of interconnection holes with its respective mounting holes;
e. fourth means for mounting additional electrical components in a fourth component column on said first side of said support board on the second side of and substantially parallel to said second channel member, said fourth means including a fourth plurality of mounting holes through said support board for receiving the electrical leads of any electrical components mounted in said fourth component column;
f. a fourth plurality of mounting holes through said support board for receiving the electrical leads of any electrical components mounted in said fourth component column;
g. a fourth plurality of interconnection holes through said support board, each of said fourth plurality of interconnection holes corresponding to a respective one of said fourth plurality of mounting holes; and
h. printed circuit connectors electrically connecting each of said fourth plurality of interconnection holes with its respective mounting hole.

8. The combination of claim 7 which further includes printed circuit connectors electrically connecting predetermined ones of said second plurality of interconnection holes with respective predetermined ones of said third plurality of interconnection holes.

9. The combination of claim 3 which further includes an electrically conducting wire bridge connected between predetermined ones of said mounting holes in said second component column and respective predetermined ones of said mounting holes in said third component column.

10. The combination of claim 3 which further includes a channel cover member secured to and covering the open side of said channel member.

* * * * *